(12) United States Patent
Iso et al.

(10) Patent No.: US 12,288,686 B2
(45) Date of Patent: Apr. 29, 2025

(54) GaN SUBSTRATE WAFER AND METHOD FOR MANUFACTURING SAME

(71) Applicant: MITSUBISHI CHEMICAL CORPORATION, Tokyo (JP)

(72) Inventors: Kenji Iso, Tokyo (JP); Yuuki Enatsu, Tokyo (JP); Kenji Shimoyama, Tokyo (JP)

(73) Assignee: MITSUBISHI CHEMICAL CORPORATION, Tokyo (JP)

( * ) Notice: Subject to any disclaimer, the term of this patent is extended or adjusted under 35 U.S.C. 154(b) by 566 days.

(21) Appl. No.: 17/536,252

(22) Filed: Nov. 29, 2021

(65) Prior Publication Data

US 2022/0084819 A1   Mar. 17, 2022

Related U.S. Application Data

(63) Continuation of application No. PCT/JP2020/021132, filed on May 28, 2020.

(30) Foreign Application Priority Data

May 30, 2019 (JP) ................................. 2019-101183
Jun. 19, 2019 (JP) ................................. 2019-113569

(51) Int. Cl.
*H01L 21/02* (2006.01)
*C30B 25/20* (2006.01)
*H01L 29/20* (2006.01)

(52) U.S. Cl.
CPC ........ *H01L 21/02389* (2013.01); *C30B 25/20* (2013.01); *H01L 21/02008* (2013.01); *H01L 21/02433* (2013.01); *H01L 21/02458* (2013.01); *H01L 21/0254* (2013.01); *H01L 29/2003* (2013.01)

(58) Field of Classification Search
None
See application file for complete search history.

(56) References Cited

U.S. PATENT DOCUMENTS

| 2007/0096147 A1 | 5/2007 | Oshima |
| 2009/0081110 A1 | 3/2009 | Shibata et al. |

(Continued)

FOREIGN PATENT DOCUMENTS

| CN | 107407008 A | 11/2017 |
| CN | 109563641 A | 4/2019 |

(Continued)

OTHER PUBLICATIONS

English translation of the International Preliminary Report on Patentability and Written Opinion issued Dec. 9, 2021 in PCT/JP2020/021132, 6 pages.

(Continued)

*Primary Examiner* — Seth Dumbris
(74) *Attorney, Agent, or Firm* — Element IP, PLC

(57) ABSTRACT

Provided are: a GaN substrate wafer having a crystallinity suitable as a substrate for a semiconductor device as well as an improved productivity; and a method of producing the same. The GaN substrate wafer is a (0001)-oriented GaN substrate wafer that includes a first region arranged on an N-polar side and a second region arranged on a Ga-polar side via a regrowth interface therebetween. In this GaN substrate wafer, the second region has a minimum thickness of not less than 20 μm, the concentration of at least one element selected from Li, Na, K, F, Cl, Br, and I in the first region is $1\times10^{15}$ atoms/cm$^3$ or higher, and the second region satisfies one or more conditions selected from the following (a) to (c): (a) the Si concentration is $5\times10^{16}$ atoms/cm$^3$ or higher; (b) the O concentration is $3\times10^{16}$ atoms/cm$^3$ or lower; and (c) the H concentration is $1\times10^{17}$ atoms/cm$^3$ or lower.

33 Claims, 7 Drawing Sheets

(56) References Cited

U.S. PATENT DOCUMENTS

| | | | |
|---|---|---|---|
| 2013/0108537 A1 | 5/2013 | Mikawa et al. | |
| 2015/0014817 A1 | 1/2015 | Hashimoto | |
| 2017/0362739 A1 | 12/2017 | Kajimoto et al. | |
| 2018/0038010 A1 | 2/2018 | Mori et al. | |
| 2018/0195206 A1 | 7/2018 | Jiang et al. | |
| 2019/0165187 A1* | 5/2019 | Tanaka | H01L 29/0692 |
| 2019/0189439 A1 | 6/2019 | Mikawa et al. | |
| 2021/0249266 A1* | 8/2021 | D'Evelyn | C30B 29/406 |

FOREIGN PATENT DOCUMENTS

| | | | |
|---|---|---|---|
| JP | 2008179536 A | | 8/2008 |
| JP | 2009269816 A | | 11/2009 |
| JP | 2014062029 A | | 4/2014 |
| JP | 2014118323 A | | 6/2014 |
| JP | 2016-533028 A | * | 10/2016 |
| JP | 2017019709 A | | 1/2017 |
| JP | 2018024538 A | | 2/2018 |
| KR | 1020170100629 A | | 9/2017 |
| WO | WO-2015006712 A2 | | 1/2015 |
| WO | WO-2016098518 A1 | | 6/2016 |
| WO | WO-2018230150 A1 | | 12/2018 |

OTHER PUBLICATIONS

International Search Report issued Jul. 14, 2020 in PCT/JP2020/021132, 2 pages.

Iwinska, M. et al., "Crystal growth of HVPE-GaN doped with germanium", Journal of Crystal Growth, 2017, vol. 480, pp. 102-107.

M. Bockowski, et.al., "Doping in bulk HVPE-GaN grown on native seeds—highly conductive and semi-insulating crystals", Journal of Crystal Growth, 2018, vol. 499, pp. 1-7.

Combined Chinese Office Action and Search Report issued Jul. 12, 2023 in corresponding Chinese Patent Application No. 202080040338.3 (with English machine translation), 28 pages.

Extended European Search Report issued Jul. 8, 2022 issued in European patent Application No. 20815287.6, 7 pages.

Grzegory et al., "Growth of GaN:Mg crystals by high nitrogen pressure solution method in multi-feed-seed configuration", Journal of Crystal Growth, vol. 350, No. 1, XP28924331, 2012, pp. 50-55, Available Online: Dec. 13, 2011.

Office Action issued Mar. 1, 2024 in corresponding Chinese Patent Application No. 202080040338.3 (with machine English translation), 22 pages.

Combined Office Action and Search Report issued Sep. 3, 2024 in TW Patent Application No. 109117752 (with English translation), 21 pages.

Office Action issued Jul. 3, 2024 in CN Patent Application No. 202080040338.3, (with machine English translation), 20 pages.

Office Action issued Jul. 30, 2024 in Japanese Patent Application No. 2021-522863 (with machine English translation), 10 pages.

Office Action issued May 27, 2024 in corresponding Korean Patent Application No. 10-2021-7039706 (with machine English translation), 37 pages.

\* cited by examiner

GaN SUBSTRATE WAFER AND METHOD FOR MANUFACTURING SAME

CROSS-REFERENCE TO RELATED APPLICATION

This is a continuation of International Application PCT/JP2020/021132, filed on May 28, 2020, and designated the U.S., and claims priority from Japanese Patent Application 2019-101183 which was filed on May 30, 2019, and Japanese Patent Application 2019-113569 which was filed on Jun. 19, 2019, the entire contents of which are incorporated herein by reference.

TECHNICAL FIELD

The present invention relates to a substrate wafer containing GaN (gallium nitride), and a method of producing the same. The term "substrate wafer" used herein means a wafer that is used as a substrate in the production of a semiconductor device.

BACKGROUND ART

Attempts have been made to grow intentionally undoped bulk GaN crystals and bulk GaN crystal doped with various impurities by hydride vapor phase epitaxy (HVPE) using a GaN crystal grown by an ammonothermal method as a seed (Non-patent Document 1).

In GaN substrates, it is often required to add a dopant at a concentration of $1\times10^{-8}$ atoms/cm$^3$ or higher for the purpose of improving the electrical conductivity or the carrier concentration, or increasing the resistivity.

RELATED ART DOCUMENT

Non-Patent Document

Non-patent Document 1: M. Bockowski, et al., Journal of Crystal Growth 499 (2018) 1-7

SUMMARY OF THE INVENTION

Problems to be Solved by the Invention

According to an ammonothermal method, a highly crystalline GaN crystal can be grown since the growth environment is close to an equilibrium state.

However, it is not desirable from the standpoint of production efficiency to use a GaN wafer sliced from a bulk GaN crystal grown by an ammonothermal method directly as a substrate wafer for the production of a semiconductor device.

For instance, a bulk GaN crystal grown by an ammonothermal method often has a high impurity concentration due to unintentional doping; therefore, the dopant concentration is likely to vary between growth lots.

In addition, in an ammonothermal method, since a GaN crystal grows while consuming raw materials in a sealed container, the ratio of the GaN raw material concentration and the dopant raw material concentration in the growth environment is not constant from the start to the end of the crystal growth and, therefore, it is not easy to grow a bulk GaN crystal that has a uniform dopant concentration distribution inside.

Because of these factors, in GaN wafers produced by slicing a bulk GaN crystal grown by an ammonothermal method, the electrical characteristics are largely variable between wafers. As a result, the electrical characteristics do not satisfy prescribed specifications, and thus products not acceptable for the use in the production of an intended semiconductor device, i.e. non-conforming products, are generated in a large number.

On the other hand, in HVPE, not only it is possible to grow a GaN crystal having a lower impurity concentration than in an ammonothermal method, but also a bulk GaN crystal to which a dopant is uniformly added at a prescribed concentration can be grown since each raw material can be continuously supplied to a growth vessel from the outside at a constant supply rate throughout the growth of the GaN crystal.

Therefore, it is believed that, if a bulk GaN crystal is grown by HVPE using a GaN wafer sliced from a bulk GaN crystal grown by an ammonothermal method as a seed, a GaN wafer sliced therefrom would have good crystallinity and a small variation in the electrical characteristics and be optimal as a substrate wafer for semiconductor devices.

Such a substrate wafer, however, does not necessarily have a good production efficiency since it is produced through the step of slicing a bulk GaN crystal grown by HVPE. Since a GaN crystal is hard, it is required to spend a long time on slicing the GaN crystal so as to prevent crack generation. In such a slicing process, a kerf loss occurs inevitably.

Means for Solving the Problems

Generally speaking, a majority of a substrate wafer used in a semiconductor device production process is removed by processing; therefore, the present inventors realized that a GaN substrate wafer only needs to have a region formed by a crystal with a small variation in the electrical characteristics only partially on the front surface side.

The present invention was made based on this idea, and embodiments of the present invention include the followings.

[1] A (0001)-oriented GaN substrate wafer, including a first region arranged on an N-polar side and a second region arranged on a Ga-polar side via a regrowth interface therebetween,
wherein
the second region has a minimum thickness of not less than 20 μm,
the concentration of at least one element selected from Li, Na, K, F, Cl, Br, and I in the first region is $1\times10^{15}$ atoms/cm$^3$ or higher, and
the second region satisfies one or more conditions selected from the following (a) to (c):
(a) the Si concentration is $5\times10^{16}$ atoms/cm$^3$ or higher;
(b) the O concentration is $3\times10^{16}$ atoms/cm$^3$ or lower; and
(c) the H concentration is $1\times10^{17}$ atoms/cm$^3$ or lower.

[2] The GaN substrate wafer according to [1], satisfying one condition selected from the following (1) to (3):
(1) having a diameter of 50 mm to 55 mm and a thickness of 250 μm to 450 μm;
(2) having a diameter of 100 mm to 105 mm and a thickness of 350 μm to 750 μm; and
(3) having a diameter of 150 mm to 155 mm and a thickness of 450 μm to 800 μm.

[3] The GaN substrate wafer according to [1] or [2], wherein the minimum thickness of the second region is 300 μm or less.

[4] The GaN substrate wafer according to any one of [1] to [3], wherein a main surface of the Ga-polar side is a flat surface.

[5] The GaN substrate wafer according to [4], wherein the regrowth interface is inclined with respect to the main surface of the Ga-polar side.

[6] The GaN substrate wafer according to [5], wherein a difference in the thickness of the second region between one end and the other end in the inclination direction of the regrowth interface is not larger than 200 μm.

[7] The GaN substrate wafer according to any one of [1] to [6], wherein the first region has an H concentration of $1\times10^7$ atoms/cm$^3$ or higher.

[8] The GaN substrate wafer according to any one of [1] to [7], wherein the first region has an O concentration of $1\times10^7$ atoms/cm$^3$ or higher.

[9] The GaN substrate wafer according to any one of [1] to [8], wherein the first region has an F concentration of $1\times10^5$ atoms/cm$^3$ or higher.

[10] The GaN substrate wafer according to any one of [1] to [9], wherein at least a portion of the second region has a total compensating impurity concentration of $1\times10^{17}$ atoms/cm$^3$ or higher.

[11] The GaN substrate wafer according to [10], wherein the second region includes a main doped region including at least the main surface of the Ga-polar side, and the main doped region has a total compensating impurity concentration of $1\times10^{17}$ atoms/cm$^3$ or higher.

[12] The GaN substrate wafer according to [11], wherein the total compensating impurity concentration in the main doped region is $1\times10^{18}$ atoms/cm$^3$ or higher.

[13] The GaN substrate wafer according to [11] or [12], wherein, in the main doped region, the total compensating impurity concentration is twice or more of a total donor impurity concentration.

[14] The GaN substrate wafer according to any one of [11] to [13], wherein the main doped region contains at least one element selected from carbon and transition metal elements.

[15] The GaN substrate wafer according to any one of [11] to [14], wherein an impurity contained in the main doped region at a highest concentration is Fe, Mn, or C.

[16] The GaN substrate wafer according to any one of [11] to [15], wherein the main doped region is a region within a specific length from the main surface of the Ga-polar side, and the specific length is not less than 20 μm.

[17] The GaN substrate wafer according to any one of [11] to [16], wherein, in the main doped region, a variation in the total compensating impurity concentration along a c-axis direction is in a range of ±25% from a median value.

[18] The GaN substrate wafer according to any one of [11] to [17], wherein the main doped region is a region within a specific length from the main surface of the Ga-polar side, and the specific length is 50% or more of the minimum thickness of the second region.

[19] The GaN substrate wafer according to any one of [10] to [18], wherein the second region has a total compensating impurity concentration of $5\times10^{19}$ atoms/cm$^3$ or lower.

[20] The GaN substrate wafer according to any one of [1] to [9], wherein at least a portion of the second region has a total donor impurity concentration of $1\times10^{18}$ atoms/cm$^3$ or higher.

[21] The GaN substrate wafer according to [20], wherein the second region includes a main doped region including at least the main surface of the Ga-polar side, and the main doped region has a total donor impurity concentration of $1\times10^{18}$ atoms/cm$^3$ or higher.

[22] The GaN substrate wafer according to [21], wherein the total donor impurity concentration in the main doped region is $2\times10^{18}$ atoms/cm$^3$ or higher.

[23] The GaN substrate wafer according to [21] or [22], wherein an impurity contained in the main doped region at a highest concentration is Si or Ge.

[24] The GaN substrate wafer according to [21] or [22], wherein, in the main doped region, the total donor impurity concentration excluding Si is 10% or less of the Si concentration.

[25] The GaN substrate wafer according to [24], wherein, in the main doped region, the concentrations of donor impurity elements excluding Si and O are independently lower than $1\times10^{15}$ atoms/cm$^3$.

[26] The GaN substrate wafer according to [23], wherein, in the main doped region, the Ge concentration is $1\times10^{18}$ atoms/cm$^3$ or higher and the Si concentration is $4\times10^{17}$ atoms/cm$^3$ or higher.

[27] The GaN substrate wafer according to any one of [21] to [26], wherein the main doped region is a region within a specific length from the main surface of the Ga-polar side, and the specific length is not less than 20 μm.

[28] The GaN substrate wafer according to [27], wherein, in the main doped region, a variation in the total donor impurity concentration along the c-axis direction is in a range of ±25% from a median value.

[29] The GaN substrate wafer according to any one of [21] to [28], wherein the main doped region is a region within a specific length from the main surface of the Ga-polar side, and the specific length is 50% or more of the minimum thickness of the second region.

[30] The GaN substrate wafer according to any one of [20] to [29], wherein the second region has a total donor impurity concentration of $5\times10^{19}$ atoms/cm$^3$ or lower.

[31] An epitaxial wafer, including: the GaN substrate wafer according to any one of [1] to [30]; and at least one nitride semiconductor layer epitaxially grown on the main surface of the Ga-polar side of the GaN substrate wafer.

[32] A method of producing an epitaxial wafer, the method including the steps of:
preparing the GaN substrate wafer according to any one of [1] to [30]; and
epitaxially growing a nitride semiconductor layer on the main surface of the Ga-polar side of the GaN substrate wafer.

[33] A method of producing a nitride semiconductor device, the method including the steps of:
preparing the GaN substrate wafer according to any one of [1] to [30];
growing a nitride semiconductor layer on the main surface of the Ga-polar side of the GaN substrate wafer to obtain an epitaxial wafer; and
removing at least a portion of the first region of the GaN substrate wafer.

[34] A method of producing a GaN substrate wafer that includes a region on an N-polar side and a region on a Ga-polar side via a regrowth interface therebetween, the method including:

the first step of preparing a c-plane GaN wafer formed of an ammonothermally grown GaN crystal; and the second step of obtaining a wafer having a laminated structure by growing a (0001)-oriented GaN film of not less than 20 μm in thickness on the c-plane GaN wafer by HVPE.

[35] The method of producing a GaN substrate wafer according to [34], wherein the GaN substrate wafer satisfies one condition selected from the following (1) to (3):

(1) having a diameter of 50 mm to 55 mm and a thickness of 250 μm to 450 μm;

(2) having a diameter of 100 mm to 105 mm and a thickness of 350 μm to 750 μm; and (3) having a diameter of 150 mm to 155 mm and a thickness of 450 μm to 800 μm.

[36] The method of producing a GaN substrate wafer according to [34] or [35], wherein, in c-plane GaN wafer, the concentration of at least one element selected from Li, Na, K, F, Cl, Br, and I is $1 \times 10^5$ atoms/cm$^3$ or higher.

[37] The method of producing a GaN substrate wafer according to any one of [34] to [36], wherein the c-plane GaN wafer contains H at a concentration of $1 \times 10^{17}$ atoms/cm$^3$ or higher.

[38] The method of producing a GaN substrate wafer according to any one of [34] to [37], wherein the c-plane GaN wafer has an O concentration of $1 \times 10^{17}$ atoms/cm$^3$ or higher.

[39] The method of producing a GaN substrate wafer according to any one of [34] to [38], wherein the c-plane GaN wafer has an F concentration of $1 \times 10^{15}$ atoms/cm$^3$ or higher.

[40] The method of producing a GaN substrate wafer according to any one of [34] to [39], wherein at least a portion of the GaN film has a total compensating impurity concentration of $1 \times 10^{17}$ atoms/cm$^3$ or higher.

[41] The method of producing a GaN substrate wafer according to [40], wherein the GaN film includes a specific doped region which has a length of not less than 1 μm in a c-axis direction, and in which a total compensating impurity concentration is $1 \times 10^{17}$ atoms/cm$^3$ or higher.

[42] The method of producing a GaN substrate wafer according to [41], wherein the total compensating impurity concentration in the specific doped region is $1 \times 10^{18}$ atoms/cm$^3$ or higher.

[43] The method of producing a GaN substrate wafer according to [41] or [42], wherein, in the specific doped region, the total compensating impurity concentration is twice or more of a total donor impurity concentration.

[44] The method of producing a GaN substrate wafer according to any one of [41] to [43], wherein, in the specific doped region, a variation in the total compensating impurity concentration along the c-axis direction is in a range of ±25% from a median value.

[45] The method of producing a GaN substrate wafer according to any one of [41] to [44], wherein the length of the region is 50% or more of the thickness of the GaN film.

[46] The method of producing a GaN substrate wafer according to any one of [41] to [45], wherein the length from a lower end of the specific doped region to an interface of the GaN film and the second c-plane GaN wafer is 1 μm or greater.

[47] The method of producing a GaN substrate wafer according to any one of [41] to [46], wherein the specific doped region contains at least one element selected from carbon and transition metal elements.

[48] The method of producing a GaN substrate wafer according to [47], wherein an impurity contained in the specific doped region at a highest concentration is Fe, Mn, or C.

[49] The method of producing a GaN substrate wafer according to any one of [40] to [48], wherein the total compensating impurity concentration in the GaN film is $5 \times 10^{19}$ atoms/cm$^3$ or lower.

[50] The method of producing a GaN substrate wafer according to any one of [34] to [49], wherein at least a portion of the GaN film has a total donor impurity concentration of $1 \times 10^{18}$ atoms/cm$^3$ or higher.

[51] The method of producing a GaN substrate wafer according to [50], wherein, in the GaN film, the total donor impurity concentration in the specific doped region having a length of not less than 20 μm in the c-axis direction is $1 \times 10^{18}$ atoms/cm$^3$ or higher.

[52] The method of producing a GaN substrate wafer according to [51], wherein the total donor impurity concentration in the specific doped region is $2 \times 10^{18}$ atoms/cm$^3$ or higher.

[53] The method of producing a GaN substrate wafer according to [51] or [52], wherein, in the specific doped region, a variation in the total donor impurity concentration along the c-axis direction is in a range of ±25% from a median value.

[54] The method of producing a GaN substrate wafer according to any one of [51] to [53], wherein the length of the specific doped region in the c-axis direction is 50% or more of the thickness of the GaN film.

[55] The method of producing a GaN substrate wafer according to any one of [51] to [54], wherein the length from a lower end of the specific doped region to an interface of the GaN film and the second c-plane GaN wafer is 1 μm or greater.

[56] The method of producing a GaN substrate wafer according to any one of [51] to [55], wherein a dopant contained in the specific doped region at a highest concentration is Si or Ge.

[57] The method of producing a GaN substrate wafer according to any one of [51] to [55], wherein, in the specific doped region, the total donor impurity concentration excluding Si is 10% or less of the Si concentration.

[58] The method of producing a GaN substrate wafer according to [57], wherein, in the specific doped region, the concentrations of donor impurity elements excluding Si and O are independently lower than $1 \times 10^{15}$ atoms/cm$^3$.

[59] The method of producing a GaN substrate wafer according to [56], wherein, in the specific doped region, the Ge concentration is $1 \times 10^{18}$ atoms/cm$^3$ or higher and the Si concentration is $4 \times 10^{17}$ atoms/cm$^3$ or higher.

[60] The method of producing a GaN substrate wafer according to any one of [50] to [59], wherein the total donor impurity concentration in the GaN film is $5 \times 10^{19}$ atoms/cm$^3$ or lower.

[61] The method of producing a GaN substrate wafer according to any one of [34] to [60], further including the thinning step of thinning the laminated structure after the second step.

[62] The method of producing a GaN substrate wafer according to [61], wherein the GaN film has a thickness difference of 50 µm or greater before and after the thinning step.

[63] The method of producing a GaN substrate wafer according to [61] or [62], wherein the GaN film has a thickness difference of 200 µm or less before and after the thinning step.

[64] The method of producing a GaN substrate wafer according to any one of [61] to [63], wherein the GaN substrate wafer has an off-cut orientation different from that of the c-plane GaN wafer.

Effects of the Invention

A GaN substrate wafer having a crystallinity suitable as a substrate for a semiconductor device as well as an improved productivity, and a method of producing the same are provided.

MODE FOR CARRYING OUT THE INVENTION

Embodiments of the present invention will now be described in detail. The following descriptions of requirements are merely examples (representative examples) of the embodiments of the present invention, and the present invention is not limited to the contents thereof within the gist of the present invention.

Unless otherwise specified, the expression "X to Y" (wherein, X and Y are arbitrary numbers) used herein encompasses not only the meaning of "X or more but Y or less", but also the meaning of "preferably larger than X" and "preferably smaller than Y".

Further, in the present specification, the term "independently" used for describing two or more subjects together means that the two or more subjects may be the same or different from each other.

1. GaN Substrate Wafer

One embodiment of the present invention relates to a GaN substrate wafer.

The GaN substrate wafer according to one embodiment is a (0001)-oriented GaN substrate wafer including a first region arranged on an N-polar side and a second region arranged on a Ga-polar side via a regrowth interface therebetween. The second region has a minimum thickness of not less than 20 µm. The first region contains at least one of Li (lithium), Na (sodium), K (potassium), F (fluorine), Cl (chlorine), Br (bromine), and I (iodine) at a concentration of $10^{15}$ atoms/cm$^3$ or higher. Regarding the impurity concentrations, the second region satisfies one or more conditions selected from the following (a) to (c):

(a) the Si (silicon) concentration is $5 \times 10^{16}$ atoms/cm$^3$ or higher;

(b) the O (oxygen) concentration is $3 \times 10^{16}$ atoms/cm$^3$ or lower; and (c) the H (hydrogen) concentration is $1 \times 10^{17}$ atoms/cm$^3$ or lower.

The term "(0001)-oriented GaN wafer" used herein refers to a GaN wafer having main surfaces (large-area surfaces) parallel to or substantially parallel to the (0001) crystal plane, namely the c-plane, and is also called "c-plane GaN wafer".

The term "impurity" used herein means a component other than Ga element and N element that are contained in a GaN substrate.

Figure 1:
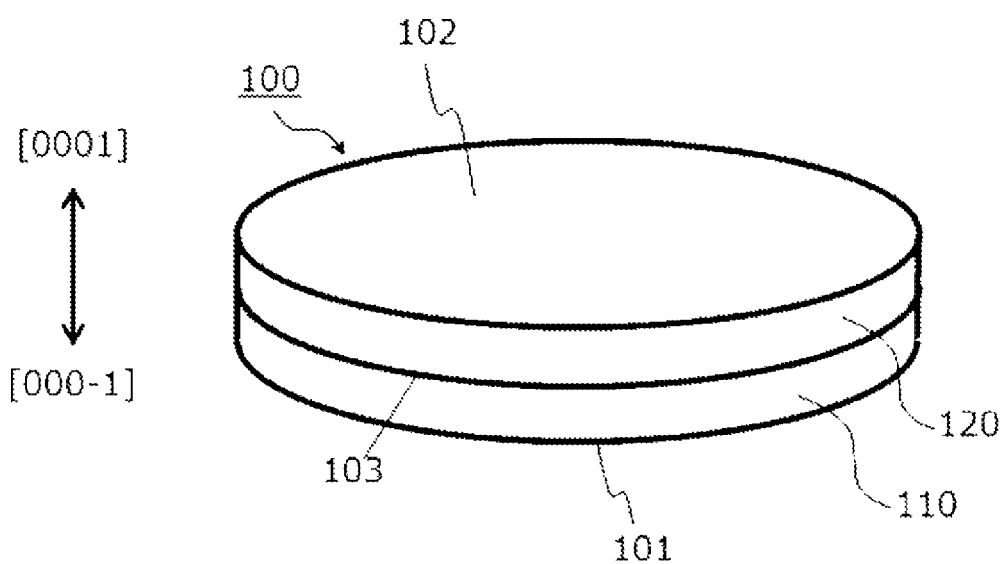
FIG. 1 is a perspective view illustrating a GaN substrate wafer according to one embodiment.
Figure 2:
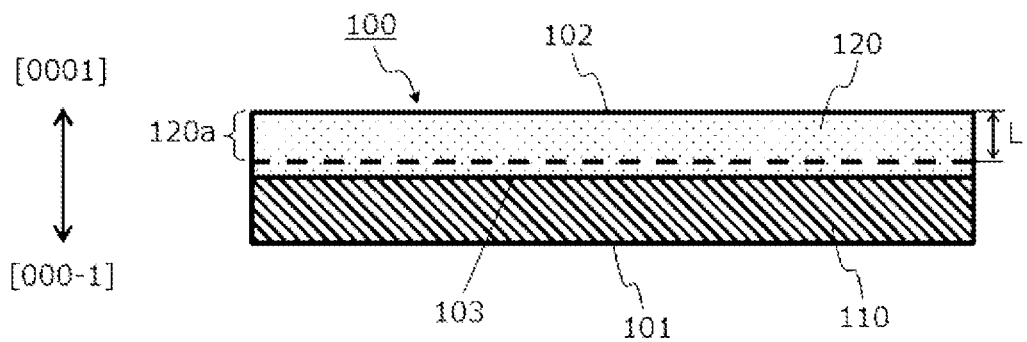
FIG. 2 is a cross-sectional view illustrating the GaN substrate wafer according to one embodiment.

FIGS. 1 and 2 illustrate an example of a GaN substrate wafer according to one embodiment. FIG. 1 is a perspective view, and FIG. 2 is a cross-sectional view.

A GaN substrate wafer 100 illustrated in FIGS. 1 and 2 is a self-supporting substrate wafer consisting of only a GaN crystal, and one of its two main surfaces is an N-polar surface 101, while the other is a Ga-polar surface 102. The N-polar surface 101 and the Ga-polar surface 102 are parallel to each other.

The GaN substrate wafer 100 is (0001)-oriented, and an inclination of the Ga-polar surface 102 with respect to the (0001) crystal plane is 10° or smaller, preferably 5° or smaller, more preferably 2.5° or smaller. The inclination may be, for example, 0.2° to smaller than 1°, or 1° to 2.5°.

The GaN substrate wafer 100 has a diameter of usually 45 mm or larger, and may be 95 mm or larger, or 145 mm or larger. The diameter is typically, for example, 50 to 55 mm (about 2 inches), 100 to 105 mm (about 4 inches), or 150 to 155 mm (about 6 inches).

A preferred range of the thickness of the GaN substrate wafer 100 varies depending on the diameter. When the diameter is about 2 inches, the thickness is preferably 250 µm or greater, more preferably 300 µm or greater, but preferably 450 µm or less, more preferably 400 µm or less. When the diameter is about 4 inches, the thickness is preferably 350 µm or greater, more preferably 400 µm or greater, but preferably 750 µm or less, more preferably 650 µm or less. When the diameter is about 6 inches, the thickness is preferably 450 µm or greater, more preferably 550 µm or greater, but preferably 800 µm or less, more preferably 700 µm or less.

As described above, the GaN substrate wafer 100 usually has a disk shape; however, in a modification example, the main surfaces may have a square shape, a rectangular shape, a hexagonal shape, an octagonal shape, an elliptical shape or the like, or may have an amorphous shape. In such a modification example, the above-described "diameter" is interchangeable with "shortest straight line passing through the center of gravity of a main surface".

The N-polar surface 101 of the GaN substrate wafer 100 is a "back surface", and may be a mirror-finished surface, a roughened surface, or a mat-finished surface.

The Ga-polar surface 102 of the GaN substrate wafer 100 is a "front surface" and, when the GaN substrate wafer 100 is used in the production of a semiconductor device, a semiconductor layer is usually epitaxially grown on the Ga-polar surface 102.

The Ga-polar surface 102 may be a surface of a grown crystal as is (as-grown); however, it is usually processed and thereby planarized. The processing performed for planarizing the Ga-polar surface 102 into a flat surface may include at least one selected from grinding and chemical mechanical polishing (CMP). In addition to these processes, etching may be performed for the purpose of removing a damaged layer. The roughness of the flat surface is not restricted; however, for example, the root-mean-square (RMS) roughness of the Ga-polar surface 102, which is measured under an atomic force microscope (AFM), is preferably less than 5 nm, more preferably less than 2 nm, still more preferably less than 1 nm, and may be less than 0.5 nm, in a measurement area of 2 μm×2 μm.

The Ga-polar surface 102 may be a surface formed by cutting; however, it is preferably a surface that has been subjected to only planarization by grinding, CMP, etching or the like without cutting.

The GaN substrate wafer 100 has a regrowth interface 103 between the two main surfaces, and has a first region 110 on the N-polar side and a second region 120 on the Ga-polar side via the regrowth interface 103 therebetween. The term "regrowth interface" used herein means an interface that is generated when a GaN crystal is grown on an arbitrary substrate, and the presence thereof can be confirmed by, for example, cathodoluminescence imaging of a cross-section of the GaN substrate wafer under a scanning electron microscope, or observation of a cross-section under a fluorescent microscope.

The regrowth interface 103 is preferably parallel to the Ga-polar surface 102. When the regrowth interface 103 is inclined from the Ga-polar surface 102, the second region 120 usually has a minimum thickness at one end of the inclined direction and a maximum thickness at the other end. A difference in the thickness of the second region 120 between the one end and the other end is preferably not larger than 200 μm.

In a production process of a nitride semiconductor device using the GaN substrate wafer 100, it is expected that the first region 110 be removed eventually. In other words, a nitride semiconductor device chip produced using the GaN substrate wafer 100 is expected not to contain any part originating from the first region 110. In this mode of use, there is no particular restriction in terms of the electrical characteristics of the GaN crystal constituting the first region 110.

The first region 110 is usually formed of an ammonothermally grown GaN crystal and thus contains at least one element selected from Li (lithium), Na (sodium), K (potassium), F (fluorine), Cl (chlorine), Br (bromine), and I (iodine) at a concentration of $1 \times 10^5$ atoms/cm$^3$ or higher. Further, the first region usually contains H (hydrogen) and O (oxygen) each independently at a concentration of $1 \times 10^{17}$ atoms/cm$^3$ or higher.

The first region 110 contains alkali metal elements such as Li, Na and K when alkali metal-containing compounds, such as LiNH$_2$, NaNH$_2$ and KNH$_2$, are used as mineralizers for ammonothermally growing the GaN crystal constituting the region.

Meanwhile, the first region 110 contains halogen elements such as F, Cl, Br and I when halogen element-containing compounds, such as NH$_4$F, NH$_4$Cl, NH$_4$Br and NH$_4$I, are used as mineralizers for ammonothermally growing the GaN crystal constituting the region.

The second region 120 is grown on the first region 110 by HVPE. The reason why the regrowth interface 103 exists between the first region 110 and the second region 120 is because the step of growing the first region 110 and the step of growing the second region 120 are not continuous. In the present specification, "HVPE" means hydride vapor phase epitaxy.

The second region 120 is formed of a GaN crystal grown by HVPE and, therefore, satisfies one or more conditions selected from the following (a) to (c) regarding the impurity concentrations:
  (a) the Si concentration is $5 \times 10^{16}$ atoms/cm$^3$ or higher;
  (b) the O concentration is $3 \times 10^{16}$ atoms/cm$^3$ or lower; and
  (c) the H concentration is $1 \times 10^{17}$ atoms/cm$^3$ or lower.

The first region 110 serving as a seed in the growth of the second region 120 gives an ammonothermally grown GaN crystal having good crystallinity; therefore, the GaN crystal constituting the second region 120 also has good crystallinity.

The second region 120 has a minimum thickness of not less than 20 μm. The reason for this is to allow, in a production process of a nitride semiconductor device chip using the GaN substrate wafer 100, the second region 120 remaining after the removal of the first region 110 from the substrate wafer 100 to play a role as a substrate that supports the structure of the semiconductor device chip. The term "minimum thickness" used herein means a thickness at a spot where the thickness is the smallest.

The minimum thickness of the second region 120 may be, for example, 50 μm or greater, 75 μm or greater, 100 μm or greater, or even 150 μm or greater.

The minimum thickness of the second region 120 is preferably 350 μm or less, more preferably 300 μm or less, and may be, for example, 250 μm or less, 200 μm or less.

When the Ga-polar surface 102 and the regrowth interface 103 are parallel to each other and the second region 120 has a uniform thickness, the second region is deemed to have a minimum thickness at all spots.

Intentional Doping of the Second Region 110 is not Indispensable.

When an ordinary HVPE method is employed, it is easy to grow a GaN crystal having a total donor impurity concentration of lower than $1 \times 10^{18}$ atoms/cm$^3$ by not performing intentional doping. It is noted here that the term "intentional doping" used herein means an addition of an element of interest as a raw material in a process of growing a GaN crystal.

The term "total donor impurity concentration" used herein refers to a sum of the concentrations of all types of donor impurities.

Elements functioning as donors in a GaN crystal are Group 14 elements, such as Si, Ge (germanium) and Sn (tin), and Group 16 elements, such as O, S (sulfur), Se (selenium) and Te (tellurium). Among these elements, Si and O can be contained in a GaN crystal grown by HVPE at a concentration of $1 \times 10^{16}$ atoms/cm$^3$ or higher even if they are not intentionally added. In contrast, donor impurities excluding Si and O, such as Group 14 elements other than Si and Group 16 elements other than O, are never independently contained in a GaN crystal grown by HVPE at a concentration of $1 \times 10^{15}$ atoms/cm$^3$ or higher unless they are intentionally added.

In one example, the second region 110 may be doped with compensating impurities at least partially.

The term "compensating impurities" used herein refers to impurities that have a function of compensating an n-type carrier in a GaN crystal, and C (carbon) and transition metal elements are well known as such impurities. The transition metal elements are typified by Fe (iron) and Mn (manganese) and, for example, Co (cobalt), Cr (chromium), V (vanadium), Ni (nickel), and Cu (copper) are also known.

In a GaN crystal grown by HVPE, unless it is intentionally doped, the total compensating impurity concentration is normally lower than $1\times10^{17}$ atoms/cm$^3$ and lower than the total donor impurity concentration. Accordingly, the total compensating impurity concentration can be increased to $1\times10^{17}$ atoms/cm$^3$ or higher by intentional doping.

In another example, the second region 110 may be doped with donor impurities at least partially.

In a preferred example, in the second region 120, a region including at least the main surface of the Ga-polar side, specifically a region within a specific length L from the Ga-polar surface 102 of the GaN substrate wafer 100, is defined as "main doped region 120a".

When the second region 120 is doped with compensating impurities, the total compensating impurity concentration in the main doped region 120a may be $1\times10^{17}$ atoms/cm$^3$ or higher, $2\times10^{17}$ atoms/cm$^3$ or higher, or $5\times10^{17}$ atoms/cm$^3$ or higher, and it is, for example, preferably $1\times10^{18}$ atoms/cm$^3$ or higher, more preferably $2\times10^{18}$ atoms/cm$^3$ or higher, or $5\times10^{18}$ atoms/cm$^3$ or higher.

When the second region 120 is doped with compensating impurities, the total compensating impurity concentration in the main doped region 120 is preferably twice or more, more preferably 5 times or more, still more preferably 10 times or more of the total donor impurity concentration, and it may be 50 times or more of the total donor impurity concentration.

When the second region 120 is doped with compensating impurities, the GaN crystal constituting the main doped region 120 may be semi-insulating, i.e. the GaN crystal may have a room-temperature resistivity of $1\times10^5$ Ω·cm or higher. Further, a compensating impurity contained in the main doped region 120 at the highest concentration is preferably Fe, Mn, or C.

When the second region 120 is doped with donor impurities, the total donor impurity concentration in at least a portion of the second region, for example, in the main doped region 120a, is preferably $1\times10^{18}$ atoms/cm$^3$ or higher, more preferably $2\times10^{18}$ atoms/cm$^3$ or higher, and may be $5\times10^{18}$ atoms/cm$^3$ or higher.

When the second region 120 is doped with donor impurities, a donor impurity contained in the main doped region 120a at the highest concentration is preferably Si or Ge, and this is mainly because of the following two reasons.

First, Si and Ge, along with O, are donor impurities having a high activation rate. The term "activation rate" used herein refers to a ratio of the carrier concentration with respect to the concentration of a donor impurity in GaN doped with the donor impurity.

Secondly, while facet growth is required for obtaining GaN containing O at a concentration of $1\times10^{18}$ atoms/cm$^3$ or higher, GaN containing Si or Ge at the same concentration can be obtained by c-plane growth.

Facet growth is a technique for growing a (0001)-oriented GaN film such that its growth surface is covered with pits. In contrast, c-plane growth is a process of growing such a GaN film in a manner that its growth surface is flat.

Threading dislocations have a property of being concentrated on the bottom of pits; therefore, when the main doped region 120a is formed by facet growth, the uniformity of the threading dislocation density on the Ga-polar surface 102 is deteriorated. However, the manufacturers of semiconductor devices prefer GaN substrate wafers having a highly uniform threading dislocation density.

It is disadvantageous to form the main doped region 120a by facet growth also from the standpoint of the productivity of the substrate wafer 100. This is because, as compared to a GaN film obtained by c-plane growth, a GaN film obtained by facet growth requires a longer processing time for surface planarization.

In one example, by controlling the total donor impurity concentration excluding Si in the main doped region 120a to be 10% or less, 5% or less, or 1% or less of the Si concentration, the carrier concentration in this region can be controlled through adjustment of the Si concentration.

In another example, Ge may be contained in the main doped region 120a at a concentration of $10^{18}$ atoms/cm$^3$ or higher. In this case, the Si concentration in this region is preferably $4\times10^{17}$ atoms/cm$^3$ or higher.

The specific length L is usually 1 μm or greater, and may be set arbitrarily within a range that does not exceed the minimum thickness of the second region 120.

In a preferred embodiment, the specific length L is set such that, even when the second region 120 is partially removed from the GaN substrate wafer 100 in addition to the first region 110 and the main doped region 120a is thereby exposed in a production process of a semiconductor device chip using the GaN substrate wafer 100, the GaN substrate consisting of only the remaining main doped region 120a can support the structure of the resulting semiconductor device chip.

In this preferred embodiment, the specific length L is at least 1 μm, preferably 10 μm or greater, more preferably 20 μm or greater, still more preferably 25 μm or greater, and may be, for example, 50 μm or greater, 75 μm or greater, 100 μm or greater, 150 μm or greater, or 200 μm or greater.

Further, the length from a lower end (end on the side of the N-polar surface 101) of the specific length L to the regrowth interface is preferably 1 un or greater, more preferably 5 μm or greater, or 10 μm or greater, but preferably 50 μm or less, more preferably 30 μm or less.

In this preferred embodiment, the specific length L is preferably not less than 50%, more preferably not less than 75%, still more preferably not less than 90% of the minimum thickness of the second region 120.

In this preferred embodiment, it is desired that a variation in the electrical characteristics along the c-axis direction, which is the thickness direction of the GaN substrate wafer 100, be small in the main doped region 120a.

Accordingly, when compensating impurities are added to the region 120a, a variation in the total compensating impurity concentration along the c-axis direction in the region 120a is preferably within ±25%, more preferably within ±20%, still more preferably within ±15%, yet still more preferably within ±10%, from a median value.

Further, when donor impurities are added to the region 120a, a variation in the total donor impurity concentration along the c-axis direction in the region 120a is preferably within ±25%, more preferably within ±20%, still more preferably within ±15%, yet still more preferably within ±10%, from a median value.

When the second region 120 is doped with compensating impurities, in order to avoid marked deterioration of the crystal quality caused by excessive doping, the total compensating impurity concentration in the second region 120 including the main doped region 120a can be controlled to be $5\times10^{19}$ atoms/cm$^3$ or lower, $2\times10^{19}$ atoms/cm$^3$ or lower, or $1\times10^{19}$ atoms/cm$^3$ or lower.

When the second region 120 is doped with donor impurities, in order to avoid marked deterioration of the crystal quality caused by excessive doping, the total donor impurity concentration in the second region 120 including the main doped region 120a can be controlled to be $5 \times 10^{19}$ atoms/cm$^3$ or lower, or $2 \times 10^{19}$ atoms/cm$^3$ or lower, or $1 \times 10^{19}$ atoms/cm$^3$ or lower.

In the lowermost portion of the second region 120, namely the portion adjacent to the first region 110, the concentration of impurities of the same kind as those intentionally added to the main doped region 120a may increase continuously or stepwise in the direction away from the first region 110.

The second region 120 is usually grown by HVPE and, therefore, satisfies one or more conditions selected from the following (a') to (c') regarding the impurity concentrations:
- (a') the Si concentration is $5 \times 10^{16}$ atoms/cm$^3$ or higher;
- (b') the O concentration is $3 \times 10^{16}$ atoms/cm$^3$ or lower; and
- (c') the H concentration is $1 \times 10^1$ atoms/cm$^3$ or lower.

Figure 3:
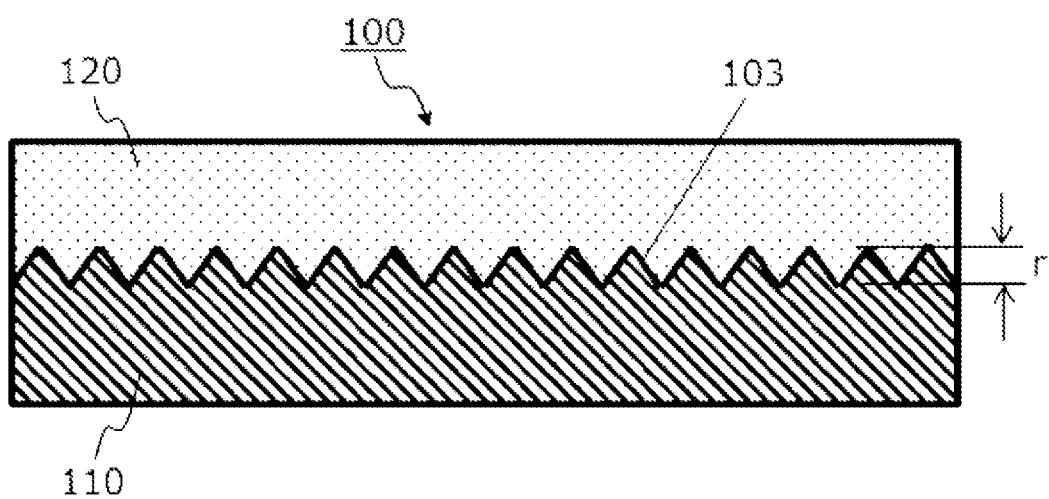
FIG. 3 is a cross-sectional view illustrating a GaN substrate wafer according to another embodiment.

In one example, as illustrated in FIG. 3, the regrowth interface 103 may be a rough surface. For example, when the surface of the first region 110 is roughened by etching before growing the second region 120, the regrowth interface 103 can be a rough surface. When a direction that is perpendicular to the regrowth interface 103 and extends from the first region 110 toward the second region 120 is defined as height direction and a difference in height between the highest point and the lowest point on the regrowth interface is defined as roughness (r) of the regrowth interface, the roughness (r) can be, for example, 0.3 µm to 12 µm.

In addition, the edges of the GaN substrate wafer 100 may be chamfered, although this is not illustrated in FIGS. 1 to 3. Further, as required, the GaN substrate wafer 100 may be provided with various markings, such as an orientation flat or notch that indicates the crystal orientation, and an index flat for making it easier to distinguish the front surface from the back surface.

When the second region 120 is doped with compensating impurities, the GaN substrate wafer 100 can be preferably used in the production of a nitride semiconductor device having a horizontal device structure, such as GaN-HEMT.

The term "nitride semiconductor device" used herein refers to a semiconductor device in which a major portion of the device structure is constituted by a nitride semiconductor. A nitride semiconductor is also called "nitride-based Group III-V compound semiconductor", "Group III nitride-based compound semiconductor", "GaN-based semiconductor" or the like, and contains GaN along with a compound obtained by partially or entirely substituting gallium of GaN with other Periodic Table Group 13 element (e.g., B, Al, or In).

A horizontal device structure can be employed not only in electronic devices other than high electron mobility transistors (HEMTs) such as bipolar transistors, but also in light-emitting devices such as light-emitting diodes (LEDs) and laser diodes (LDs).

When the second region 120 is doped with donor impurities, the GaN substrate wafer 100 can be preferably used in the production of various nitride semiconductor devices having a vertical device structure.

A vertical device structure can be employed in light-emitting devices such as laser diodes (LDs) and light-emitting diodes (LEDs), as well as electronic devices, such as rectifiers, bipolar transistors, field-effect transistors, and HEMTs.

Figure 4:
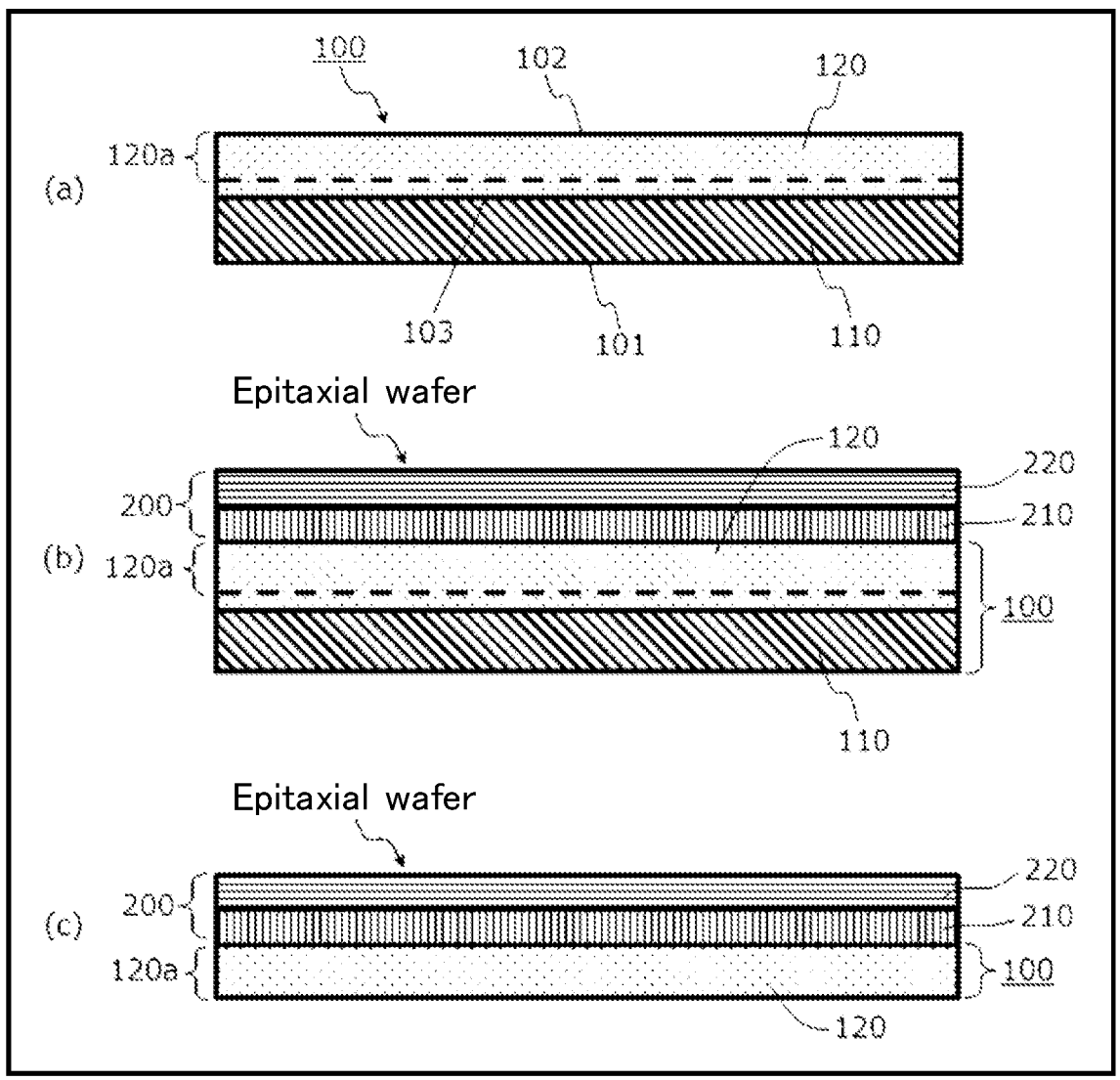
FIG. 4 is a process cross-sectional view for describing the steps of producing a nitride semiconductor device using a GaN substrate wafer according to one embodiment.

In the production of a nitride semiconductor device using the GaN substrate wafer 100, the GaN substrate wafer 100 is prepared as illustrated in FIG. 4(a), and an epitaxial film 200 which includes at least a first nitride semiconductor layer 210 and a second nitride semiconductor layer 220 is subsequently grown on the Ga-polar surface 102 by metalorganic vapor phase epitaxy (MOVPE) as illustrated in FIG. 4(b), whereby an epitaxial wafer is formed.

For example, when the nitride semiconductor device is a HEMT, the first nitride semiconductor layer 210 and the second nitride semiconductor layer 220 can be an undoped GaN channel layer and an undoped AlGaN carrier supply layer, respectively.

For example, when the nitride semiconductor device is a p-n diode, the first nitride semiconductor layer 210 and the second nitride semiconductor layer 220 can be an n-type GaN layer and a p-type GaN layer, respectively.

After the thus obtained epitaxial wafer is subjected to a semiconductor processing that may include etching, ion implantation, electrode formation, protective film formation and the like, the epitaxial wafer is divided into nitride semiconductor device chips. Prior to this division, for thinning of the epitaxial wafer, at least a portion of the first region 110 of the GaN substrate wafer 100 is usually removed by grinding, etching or the like as illustrated in FIG. 4(c).

This thinning process may be performed such that a ring-form thick part remains on the outer periphery of the epitaxial wafer. In other words, the first region 110 of the GaN substrate wafer 100 may be removed only in those parts excluding the outer periphery of the epitaxial wafer.

In FIG. 4(c), the second region 120 is also partially removed from the GaN substrate wafer 100 such that the main doped region 120a is exposed on the N-polar surface side of the thus thinned epitaxial wafer.

When the second region 120 is doped with donor impurities, the epitaxial wafer may be divided after an electrode is formed on the surface of the second region 120 exposed by the removal of the first region 110.

It is noted here that a semiconductor device using the GaN substrate wafer 100 is not limited only to a nitride semiconductor device.

2. Method of Producing GaN Substrate Wafer

Next, a method of producing a GaN substrate wafer, which is another embodiment of the present invention, will be described. The below-described production method is a preferred mode of producing the above-described GaN substrate wafer. Examples of a preferred mode of the GaN substrate wafer obtained by the below-described method of producing a GaN substrate wafer include the above-described GaN substrate wafer.

The above-described GaN substrate wafer 100 according to one embodiment can be preferably produced by the below-described method. This method is applied to the production of a GaN substrate wafer having an N-polar side region and a Ga-polar side region via a regrowth interface therebetween, and includes the following steps:

(i) the first step of preparing a c-plane GaN wafer formed of an ammonothermally grown GaN crystal; and (ii) the second step of obtaining a laminated structure by growing a (0001)-oriented GaN film of not less than 20 µm in thickness by HVPE on the c-plane GaN wafer prepared in the first step.

In the present specification, "on a wafer" is synonymous to "on the surface of a wafer".

The above-described first and second steps will now be described in detail. It is noted here that the structures and the properties of the above-described first and second regions can be applied to those of the c-plane GaN wafer obtained in the first step and the GaN film obtained in the second step, respectively.

Figure 5:
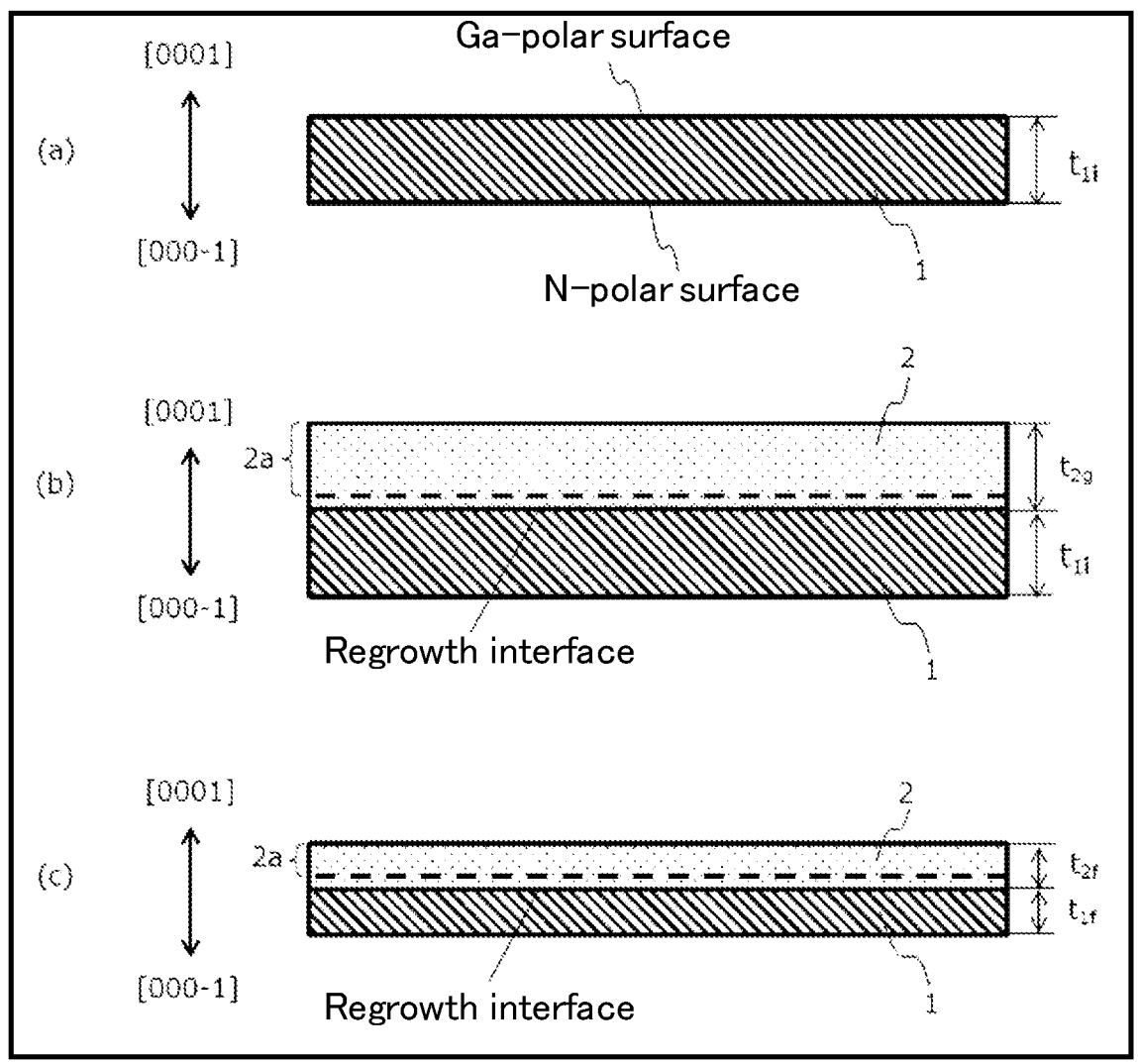
FIG. 5 is a process cross-sectional view for describing a method of producing a GaN substrate wafer according to one embodiment.

In the first step, a c-plane GaN wafer 1 of which a cross-section is illustrated in FIG. 5(*a*) is prepared.

The c-plane GaN wafer 1 is formed of an ammonothermally grown GaN crystal.

Figure 6:
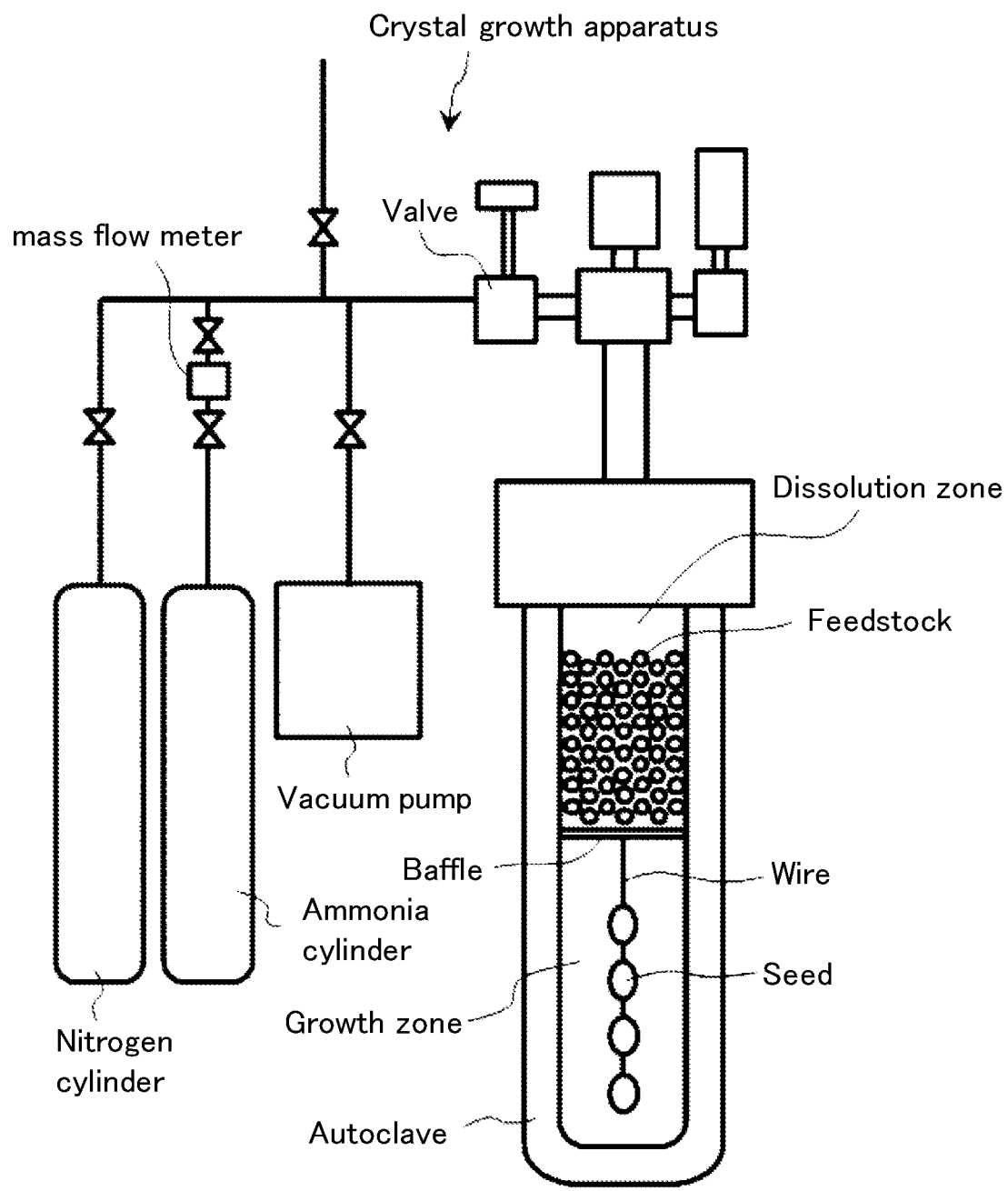
FIG. 6 is a schematic drawing that illustrates a basic configuration of a crystal growth apparatus used in an ammonothermal method.

FIG. 6 schematically illustrates an ordinary configuration of a crystal growth apparatus used for ammonothermally growing the GaN crystal constituting the c-plane GaN wafer 1.

Referring to FIG. 6, the crystal growth apparatus includes an autoclave, and a dissolution zone and a growth zone, which are partitioned from each other by a baffle, are arranged inside the autoclave. When growing a GaN crystal, a feedstock is placed in the dissolution zone along with a mineralizer (not illustrated), and a seed is suspended by a wire in the growth zone. The feedstock is preferably polycrystalline GaN.

A gas line to which a vacuum pump, an ammonia cylinder, and a nitrogen cylinder are connected is connected to the autoclave via a valve. When $NH_3$ (ammonia) is introduced into the autoclave, the amount of $NH_3$ supplied from the ammonia cylinder can be checked by a mass flow meter.

The pressure inside the autoclave upon heating of the autoclave to a prescribed temperature is determined in accordance with the amount of $NH_3$ introduced into the autoclave.

Once the seed, the feedstock, the mineralizer and $NH_3$ are introduced to the autoclave, the autoclave is hermetically sealed and then heated by heaters (not illustrated) from outside such that a supercritical state is established inside the autoclave. In order to create a temperature gradient between the dissolution zone and the growth zone, the upper part and the lower part of the autoclave are separately heated by plural heaters.

The feedstock is dissolved in the dissolution zone, and GaN is recrystallized on the seed in the growth zone.

As the mineralizer, a basic mineralizer and an acidic mineralizer can both be used.

The basic mineralizer is preferably an alkali metal element-containing compound, and representative examples thereof include alkali metal amides, such as $LiNH_2$, $NaNH_2$, and $KNH_2$.

The acidic mineralizer is preferably a halogen element-containing compound, and representative examples thereof include: ammonium halides, such as $NH_4F$, $NH_4Cl$, $NH_4Br$, and $NH_4I$; and gallium halides, such as $GaF_3$, $GaCl_3$, $GaBr_3$, and $GaI_3$.

From the standpoint of growing a GaN crystal having a low impurity concentration at a high rate, a fluorine-containing compound such as $NH_4F$ or $GaF_3$, particularly $NH_4F$, can be most preferably used as the mineralizer. Pre-synthesized $NH_4F$ may be prepared and introduced to the autoclave, or $NH_4F$ may be synthesized by allowing $NH_3$ and HF (hydrogen fluoride) to react with each other in the autoclave or in a reaction vessel connected to the autoclave.

In one example, $NH_4F$ or $GaF_3$ may be used in combination with $NH_4Cl$, $NH_4Br$, or $NH_4I$.

When an alkali metal element-containing compound is used as the mineralizer, GaN recrystallized on the seed contains an alkali metal element originating from the mineralizer. For example, when $KNH_2$ is used as the mineralizer, GaN recrystallized on the seed contains K.

When a halogen element-containing compound is used as the mineralizer, GaN recrystallized on the seed contains a halogen element originating from the mineralizer. For example, when $NH_4F$ is used as the mineralizer, GaN recrystallized on the seed contains F.

Regardless of the mineralizer to be used, the GaN crystal grown on the seed usually contains H (hydrogen) and O (oxygen) each at a concentration of $1\times10^{17}$ atoms/cm$^3$ or higher.

Referring to FIG. 5(*a*) again, the c-plane GaN wafer 1 has an N-polar surface and a Ga-polar surface, which are parallel to each other, as main surfaces.

In the production of the above-described GaN substrate wafer 100 according to one embodiment, it is preferred, but not necessarily, that the inclination angle (cut-off angle) and the inclination direction (off-cut direction) of the Ga-polar surface with respect to the (0001) crystal plane in the c-plane GaN wafer 1 be the same as the off-cut angle and the off-cut direction that the GaN substrate wafer 100 should have.

The off-cut orientation that the GaN substrate wafer 100 should have varies depending on the demand from a semiconductor device manufacturer using the GaN substrate wafer 100; however, preparation of the c-plane GaN wafer 1 with various off-cut orientations can lead to a reduction in the production efficiency of the GaN substrate wafer 100. Attention must also be given to the point that the optimum conditions for the growth of a GaN film 2 on the c-plane GaN wafer 1 by HVPE in the subsequent second step are variable depending on the cut-off orientation of the c-plane GaN wafer 1.

An initial thickness $t_{1i}$ of the c-plane GaN wafer 1 may be less than the thickness that a GaN substrate wafer used in the production of a nitride semiconductor device usually has. This is because the c-plane GaN wafer 1 only needs to not be broken before the subsequent second step, which is different from a GaN substrate wafer that is required to withstand a semiconductor processing that includes a large number of steps.

For example, when the c-plane GaN wafer 1 has a diameter of about 2 inches, the initial thickness $t_{1i}$ thereof is preferably 300 µm or less, and may be 250 µm or less, or 200 µm or less.

In the second step, as illustrated in FIG. 5(*b*), a (0001)-oriented GaN film 2 of not less than 20 µm in thickness is grown on the Ga-polar surface of the c-plane GaN wafer 1 by HVPE to obtain a laminated structure. In this process, a regrowth interface is formed between the c-plane GaN wafer 1 and the GaN film 2.

Usually, the Ga-polar surface of the c-plane GaN wafer 1 is processed to be flat by appropriately using a technique such as grinding, polishing, or CMP before growing the GaN film 2 thereon (planarization step). In one example, the GaN film 2 may be grown after processing the planarized Ga-polar surface to be a rough surface by etching (roughening step).

The use of HCl (hydrogen chloride) as an etching gas enables to roughen the Ga-polar surface of GaN without using an etching mask. By providing an HCl supply line for etching on an HVPE apparatus used for growing the GaN film 2, the Ga-polar surface of the c-plane GaN wafer 1 can be roughened inside a reactor of the HVPE apparatus immediately before growing the GaN film 2.

The GaN film 2 may be grown without intentional doping, or may be doped with compensating impurities or donor impurities at least partially.

In a preferred example, a specific doped region 2a may be arranged on the GaN film 2. The length of the specific doped region 2a in the c-axis direction is, for example, 1 µm or greater, and may be 10 µm or greater, 20 µm or greater, 25 µm or greater, 50 µm or greater, 75 µm or greater, 100 µm or greater, 150 µm or greater, or 200 µm or greater.

An upper end (end on the [0001] side) of the specific doped region 2a may be positioned preferably within 10 μm, more preferably within 5 μm from the upper surface of the GaN film 2, or may constitute the upper surface of the GaN film 2.

The length from a lower end (end on the [000-1] side) of the specific doped region 2a to an interface of the c-plane GaN wafer 1 and the GaN film 2 is preferably 1 μm or greater, more preferably 5 μm or greater, or 10 μm or greater, but preferably 50 μm or less, more preferably 30 μm or less.

The length of the specific doped region 2a in the c-axis direction is also preferably not less than 50%, more preferably not less than 75%, still more preferably not less than 90% of the thickness of the GaN film 2.

When the GaN film 2 is doped with compensating impurities, the total compensating impurity concentration in the specific doped region 2a is at least $1\times10^{17}$ atoms/cm$^3$, and may be, for example, $2\times10^{18}$ atoms/cm$^3$ or higher, $5\times10^{17}$ atoms/cm$^3$ or higher, $1\times10^{18}$ atoms/cm$^3$ or higher, $2\times10^{18}$ atoms/cm$^3$ or higher, or $5\times10^{18}$ atoms/cm$^3$ or higher.

When the GaN film 2 is doped with compensating impurities, the total compensating impurity concentration in the specific doped region 2a is preferably twice or more, more preferably 5 times or more, still more preferably 10 times or more of the total donor impurity concentration, and it may be 50 times or more of the total donor impurity concentration.

When the GaN film 2 is doped with compensating impurities, the GaN crystal in the specific doped region 2a may be semi-insulating, i.e. the GaN crystal may have a room-temperature resistivity of $1\times10^5$ Ω·cm or higher.

When the GaN film 2 is doped with donor impurities, the total donor impurity concentration in the specific doped region 2a is at least $1\times10^{18}$ atoms/cm$^3$, preferably $2\times10^{18}$ atoms/cm$^3$ or higher, more preferably $5\times10^{18}$ atoms/cm$^3$ or higher.

When the GaN film 2 is doped with donor impurities, a donor impurity added to the specific doped region 2a at the highest concentration is preferably Si or Ge.

In one example, the total donor impurity concentration excluding Si in the specific doped region 2a may be 10% or less, 5% or less, or 1% or less of the Si concentration.

In another example, Ge may be contained in the specific doped region 2a at a concentration of $1\times10^{18}$ atoms/cm$^3$ or higher. In this case, the Si concentration in this region is preferably $4\times10^{17}$ atoms/cm$^3$ or higher.

In the specific doped region 2a, it is desired that a variation in the electrical characteristics along the c-axis direction be small.

Accordingly, when compensating impurities are added to the region 2a, a variation in the total compensating impurity concentration along the c-axis direction in the region 2a is preferably within ±25%, more preferably within ±20%, still more preferably within ±15%, yet still more preferably within ±10%, from a median value.

Further, when donor impurities are added to the region 2a, a variation in the total donor impurity concentration along the c-axis direction in the region 2a is preferably within ±25%, more preferably within ±20%, still more preferably within ±15%, yet still more preferably within 101, from a median value.

When the GaN film 2 is doped with compensating impurities, in order to avoid marked deterioration of the crystal quality caused by excessive doping, the total compensating impurity concentration in the GaN film 2 including the specific doped region 2a can be controlled to be $5\times10^{19}$ atoms/cm$^3$ or lower, $2\times10^{19}$ atoms/cm$^3$ or lower, or $1\times10^{19}$ atoms/cm$^3$ or lower.

When the GaN film 2 is doped with donor impurities, in order to avoid marked deterioration of the crystal quality caused by excessive doping, the total donor impurity concentration in the GaN film 2 including the specific doped region 2a can be controlled to be $5\times10^{19}$ atoms/cm$^3$ or lower, or $2\times10^{19}$ atoms/cm$^3$ or lower, or $1\times10^{19}$ atoms/cm$^3$ or lower.

In a lowermost portion of the GaN film 2, namely a portion adjacent to the c-plane GaN wafer 1, compensating impurities of the same kind as those added to the specific doped region 2a may be added such that the concentration thereof increases continuously or stepwise in the direction away from the c-plane GaN wafer 1.

A growth thickness $t_{2g}$ of the GaN film 2 may be set in accordance with a design thickness of the region on the Ga-polar side of the GaN substrate wafer to be produced. Specifically, the growth thickness $t_{2g}$ may be, for example, 20 μm or greater, 50 μm or greater, 75 μm or greater, 100 μm or greater, or 150 μm or greater, but 500 μm or less, 350 μm or less, 300 μm or less, 250 μm or less, or 200 μm or less.

In the production of the above-described GaN substrate wafer 100, the growth thickness $t_{2g}$ of the GaN film 2 may be the same as the design thickness of the second region 120 in the GaN substrate wafer; however, the growth thickness $t_{2g}$ is preferably greater than the design thickness, and this enables to planarize the surface of the GaN film 2 in the subsequent thinning step. Accordingly, in order to secure a machining allowance for the planarization, the growth thickness $t_{2g}$ of the GaN film 2 is greater than a maximum design thickness of the second region 120 by preferably at least 50 μm, more preferably at least 100 μm. A machining allowance of larger than 200 μm is normally not required. In other words, a difference in the thickness of the GaN film 2 before and after the thinning step is preferably 200 μm or smaller.

For example, when the growth thickness $t_{2g}$ of the GaN film 2 is greater than the maximum design thickness of the second region 120 by 50 μm or more, the thickness of the GaN film 2 is reduced by at least 50 μm in the subsequent thinning step. In other words, a difference in the thickness of the GaN film 2 before and after the thinning step is 50 μm or larger.

In the production of the above-described GaN substrate wafer 100, the growth thickness $t_{2g}$ of the GaN film 2 can be controlled to be 500 μm or less even in a wafer having a large diameter, for example, a wafer having a diameter of 6 inches.

Since the growth thickness $t_{2g}$ only needs to be small, the GaN film 2 can be formed in a relatively short time and, therefore, the GaN film 2 can be grown on a large number of c-plane GaN wafers 1 at once without having to worry about clogging of an exhaust system of HVPE apparatus caused by a byproduct an NH$_4$Cl (ammonium chloride). Consequently, the through-put in the second step can be extremely high.

Moreover, the point that the formation of the GaN film 2 requires a short time can also contribute to a reduction in the cost associated with cleaning and maintenance of an HVPE reactor. Generally speaking, deterioration of an HVPE reactor is slower when the time required for a single growth step is short, and this leads to a longer service life.

The point that the growth thickness $t_{2g}$ only needs to be small is extremely convenient for inhibiting a reduction in the yield caused by the occurrence of abnormal growth, particularly when the GaN film 2 is doped at a high concentration. This is because, in HVPE, abnormal growth occurs at a high frequency when growing a GaN crystal containing a dopant at a high concentration of $1 \times 10^{=8}$ atoms/cm$^3$ or higher to a thickness of greater than 1 mm.

After the second step, as required, the thinning step of thinning the laminated structure obtained in the second step is incorporated as illustrated in FIG. 5(c).

In FIG. 5(c), not only the thickness of the c-plane GaN wafer 1 is reduced from the initial thickness $t_{1i}$ to a final thickness $t_{1f}$, but also the thickness of the GaN film 2 is reduced from the initial thickness $t_{2i}$ to a final thickness $t_{2f}$; however, in the thinning step, only either one of the c-plane GaN wafer 1 and the GaN film 2 may be processed.

In the production of the above-described GaN substrate wafer 100 according to one embodiment, the thickness of the c-plane GaN wafer 1 and that of the GaN film 2 are reduced in the thinning step until they match the design thickness of the first region 110 and that of the second region 120 in the resulting GaN substrate wafer, respectively.

When the off-cut orientation of the GaN substrate wafer 100 to be produced is the same as that of the c-plane GaN wafer 1, the back surface of the c-plane GaN wafer 1 (the N-polar surface of the laminated structure) can be used as a reference of the plane orientation during the thinning.

When the off-cut orientation of the GaN substrate wafer 100 to be produced is different from that of the c-plane GaN wafer 1, i.e. when at least either the off-cut angle or the off-cut direction is different, the crystal orientation of the laminated structure is verified using an X-ray diffractometer prior to the thinning.

A processing method employed in the thinning step can be selected as appropriate from grinding, wrapping, CMP, dry etching, wet etching, and the like.

An HVPE apparatus that can be used in the second step included in the above-described production method will now be described referring to FIG. 7.

Figure 7:
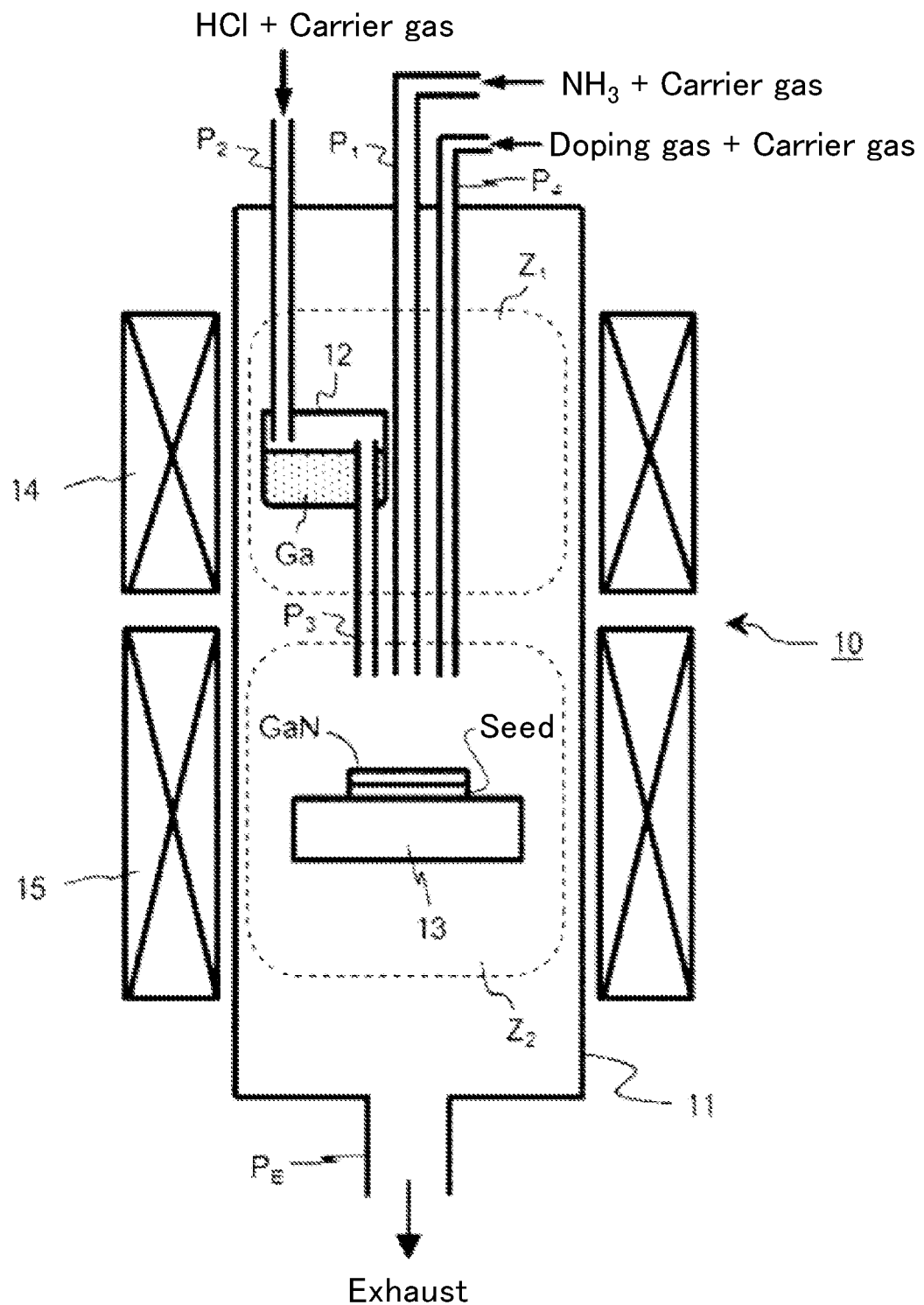
FIG. 7 is a schematic drawing that illustrates a basic configuration of an HVPE apparatus.

An HVPE apparatus 10 illustrated in FIG. 7 includes: a hot wall-type reactor 11; a gallium reservoir 12 and a susceptor 13, which are arranged inside the reactor; and a first heater 14 and a second heater 15, which are arranged on the outside of the reactor. The first heater 14 and the second heater 15 each circularly surround the reactor 11.

The reactor 11 is a quartz tube chamber. Inside the reactor 11, there are a first zone $Z_1$ mainly heated by the first heater 14, and a second zone $Z_2$ mainly heated by the second heater 15. An exhaust pipe $P_E$ is connected to a reactor end on the side of the second zone $Z_2$.

The gallium reservoir 12 arranged in the first zone $Z_1$ is a quartz container having a gas inlet and a gas outlet.

The susceptor 13 arranged in the second zone $Z_2$ is formed of, for example, graphite. A mechanism for rotating the susceptor 13 may be arranged as desired.

In order to grow GaN using the HVPE apparatus 10, after placing a seed on the susceptor 13, the inside of the reactor 11 is heated by the first heater 14 and the second heater 15. At the same time, NH$_3$ (ammonia) diluted with a carrier gas is supplied to the second zone $Z_2$ through an ammonia introduction pipe $P_1$, and HCl (hydrogen chloride) diluted with a carrier gas is supplied to the gallium reservoir 12 through a hydrogen chloride introduction pipe $P_2$. This HCl reacts with gallium metal contained in the gallium reservoir 12, and the resulting GaCl (gallium chloride) is transferred to the second zone $Z_2$ through a gallium chloride introduction pipe $P_3$.

In the second zone $Z_2$, NH$_3$ and GaCl react with each other, and the resulting GaN is crystallized on the seed placed on the susceptor 13.

When intentionally doping the growing GaN, a doping gas diluted with a carrier gas is introduced to the second zone $Z_2$ inside the reactor 11 through a dopant introduction pipe $P_4$.

With regard to the ammonia introduction pipe $P_1$, the hydrogen chloride introduction pipe $P_2$, the gallium chloride introduction pipe $P_3$ and the dopant introduction pipe $P_4$, their portions arranged inside the reactor 11 are formed of quartz.

As the carrier gas used for diluting each of NH$_3$, HCl and the doping gas, H$_2$ (hydrogen gas), N$_2$ (nitrogen gas), or a mixed gas of H$_2$ and N$_2$ is preferably used.

Preferred conditions for growing GaN using the HVPE apparatus 10 are as follows.

The temperature of the gallium reservoir is, for example, 500 to 1,000° C., preferably 700° C. or higher, but preferably 900° C. or lower.

The temperature of the susceptor is, for example, 900 to 1,100° C., preferably 930° C. or higher, more preferably 950° C. or higher, but preferably 1,050° C. or lower, more preferably 1,020° C. or lower.

A V/III ratio which is a ratio between the NH$_3$ partial pressure and the GaCl partial pressure in the reactor is, for example, 1 to 20, preferably 2 or higher, more preferably 3 or higher, but preferably 10 or lower.

An excessively high or low V/III ratio causes deterioration of the growth surface morphology of GaN. Deterioration of the growth surface morphology can be a cause of a reduction in the crystal quality.

For a certain kind of dopant, the efficiency of incorporation into a GaN crystal is strongly dependent on the crystal orientation of the growth surface. The uniformity of the concentration of such a dopant is reduced inside a GaN crystal grown under a condition where the growth surface does not have good morphology. This is because facets of various orientations exist on the growth surface having poor morphology.

A typical example of a dopant that has a clearly different efficiency of incorporation into a GaN crystal depending on the crystal orientation of the growth surface is O (oxygen), and the present inventors found that Ge (germanium) also has the same tendency. As described below, the reason why an excessive reduction of the H$_2$ molar ratio in the carrier gas is not preferred at the time of Ge doping relates to this finding.

Since O and Ge are both donor impurities, deterioration in the uniformity of their concentrations leads to deterioration in the uniformity of the specific resistance and the carrier concentration.

In addition, an excessively low V/III ratio leads to an increase in the nitrogen vacancy concentration in the growing GaN crystal. The effects of nitrogen vacancies on a GaN crystal, a GaN substrate using the GaN crystal, or a nitride semiconductor device formed on the GaN substrate are not clear at present; however, since nitrogen vacancies are point defects, it is believed that the concentration thereof should be reduced as much as possible.

The growth rate of GaN is preferably 40 to 200 µm/h, and can be controlled using the product of the NH$_3$ partial pressure and the GaCl partial pressure in the reactor as a parameter. An excessively high growth rate leads to deterioration of the surface morphology of the growing GaN.

When the GaN film 2 is doped in the second step, in order to prevent deterioration of the growth surface morphology, it is preferred to gradually increase the supply rate of the doping gas to a prescribed value over a period of several minutes to several ten minutes from the start of the supply.

For the same reason, it is preferred to start the supply of the doping gas once the GaN film 2 has been grown to at least several micrometers.

A method of incorporating compensating impurities into the GaN film 2 is not particularly restricted, and a method of introducing a doping gas into the HVPE apparatus is usually employed.

As the doping gas for C doping, for example, a hydrocarbon gas such as $CH_4$ (methane) can be used.

As the doping gas for Fe doping, for example, vaporized iron chloride can be used. An iron chloride vapor can be generated by a method of bringing HCl into contact with heated metallic iron in a carrier gas stream, or a method of allowing ferrocene (bis(cyclopentadienyl) iron) heated and vaporized in a carrier gas stream to react with HCl in the dopant introduction pipe. It is noted here that ferrocene may be replaced with other iron-containing organic compound.

As the doping gas for Mn doping, for example, metallic Mn may be placed in the introduction pipe, and a gas generated by heating this metallic Mn can be used with a flow of a carrier gas or the like.

For an addition of other transition metal element to GaN, a vapor of the transition metal element or a vapor of chloride of the transition metal element can be used as the doping gas.

As the doping gas for Si doping, $SiH_4$ (silane), $SiH_3Cl$ (monochlorosilane), $SiH_2Cl_2$ (dichlorosilane), $SiHCl_3$ (trichlorosilane), or $SiCl_4$ (tetrachlorosilane) can be preferably used.

As the doping gas for Ge doping, $GeH_4$ (germane), $GeH_3Cl$ (monochlorogermane), $GeH_2Cl_8$ (dichlorogermane), $GeHCl_3$ (trichlorogermane), or $GeCl_4$ (tetrachlorogermane) can be preferably used.

The molar ratio of $H_2$ in the carrier gas can affect the impurity concentrations of the growing GaN. The "molar ratio of $H_2$ in the carrier gas" is calculated based on the flow rates of the respective gas species supplied as carrier gas from the outside of the reactor into the reactor.

Table 1 below shows the results of investigating how the impurity concentrations in Si- or Ge-doped GaN, which was grown by HVPE using the same V/III ratio at substantially the same growth rate on a Ga-polar surface of a c-plane GaN wafer cut out from a GaN crystal grown by HVPE on a sapphire substrate, varied depending on the molar ratio of $H_2$ in a carrier gas.

increased, and the O concentration is less than 1% of the Si concentration when the molar ratio of $H_2$ is 0.7.

On the other hand, in Ge-doped GaN, when the molar ratio of $H_2$ in the carrier gas is 0 (zero), the Ge concentration is at least 10 times higher and the ratio of the Ge concentration with respect to the Si concentration is also higher as compared to when the molar ratio of $H_2$ is 0.7. Accordingly, at a glance, a lower molar ratio of $H_2$ in the carrier gas appears to be more preferred.

However, comparing a case where the molar ratio of $H_2$ in the carrier gas is 0 and a case where it is 0.7, as seen from the fact that the O concentration is also higher by one digit in the former case, the present inventors have confirmed that the growth surface morphology of GaN is poor under the condition of the former case, and a high Ge concentration is also attributed thereto. A GaN crystal having a low uniformity of the Ge concentration is grown under a condition where the molar ratio of $H_2$ in the carrier gas is excessively low.

Therefore, for the growth of Ge-doped GaN, the molar ratio of $H_2$ in the carrier gas is preferably about 0.3 to 0.7 and, in Ge-doped GaN grown under this condition, the Si concentration is $4 \times 10^{17}$ atoms/cm$^3$ or higher when the Ge concentration is $1 \times 10^{18}$ atoms/cm$^3$ or higher.

Regardless of whether GaN grown by HVPE is doped with Si or Ge, the O concentration of such GaN tends to be reduced by increasing the molar ratio of $H_2$ in the carrier gas, and can be $2 \times 10^{16}$ atoms/cm$^3$ or lower, or $1 \times 10^{16}$ atoms/cm$^3$ or lower. This is because the surface morphology during the growth is improved.

GaN grown by the HVPE apparatus 10, even when not intentionally doped, can contain O and Si at concentrations detectable by SIMS (secondary ion mass spectrometry). An Si source is quartz ($SiO_2$) used in the reactor and the pipes inside the reactor, and an O source is either or both of such quartz and water remaining inside or entering into the reactor.

Including those components omitted in FIG. 7, the components arranged inside the reactor 11 can be formed of, for example, SiC (silicon carbide), $SiN_x$ (silicon nitride), BN (boron nitride), alumina, W (tungsten) and Mo (molybdenum), in addition to quartz and carbon. This enables to control the concentration of each impurity excluding Si, O

TABLE 1

| Impurity | Concentration in Si-doped GaN [atoms/cm$^3$] | | Concentration in Ge-doped GaN [atoms/cm$^3$] | | DL (Lower detection limit) [atoms/cm$^3$] |
| --- | --- | --- | --- | --- | --- |
| | $H_2$ molar ratio = 0 | $H_2$ molar ratio = 0.7 | $H_2$ molar ratio = 0 | $H_2$ molar ratio = 0.7 | |
| Si | $8 \times 10^{17}$ | $2 \times 10^{18}$ | $7 \times 10^{16}$ | $4 \times 10^{17}$ | $7 \times 10^{14}$ |
| Ge | <DL | <DL | $1 \times 10^{19}$ | $6 \times 10^{17}$ | $1 \times 10^{15}$ |
| O | $6 \times 10^{16}$ | $8 \times 10^{15}$ | $2 \times 10^{17}$ | $1 \times 10^{16}$ | $5 \times 10^{15}$ |
| H | $4 \times 10^{16}$ | <DL | $7 \times 10^{16}$ | <DL | $3 \times 10^{16}$ |
| C | <DL | <DL | <DL | <DL | $3 \times 10^{15}$ |
| Cl | <DL | <DL | <DL | <DL | $2 \times 10^{14}$ |

As seen from Table 1, the O concentration in Si-doped GaN is 10% or less of the Si concentration when the carrier gas consists of only $N_2$. This is equivalent to that the total concentration of donors excluding Si is 10% or less of the Si concentration since O is substantially the only donor other than Si. The O concentration in Si-doped GaN is further reduced as the molar ratio of $H_2$ in the carrier gas is and H in GaN grown by the HVPE apparatus 10 to be $5 \times 10^{15}$ atoms/cm$^3$ or lower, unless GaN is intentionally doped.

The present invention has been described based on concrete embodiments; however, these embodiments were presented as examples and should not limit the scope of the present invention. The embodiments described herein can each be variously modified without departing from the spirit of the present invention and, where feasible, may be combined with any feature described by another embodiment.

DESCRIPTION OF SYMBOLS

1: c-plane GaN wafer
2: GaN film
2a: specific doped region
10: HVPE apparatus
11: reactor
12: gallium reservoir
13: susceptor
14: first heater
15: second heater
100: GaN substrate wafer
101: N-polar surface
102: Ga-polar surface
103: regrowth interface
110: first region
120: second region
120a: main doped region
200: epitaxial film
210: first nitride semiconductor layer
220: second nitride semiconductor layer

The invention claimed is:

1. A (0001)-oriented GaN substrate wafer, comprising a first region arranged on an N-polar side and a second region arranged on a Ga-polar side via a regrowth interface therebetween,
wherein
the second region has a minimum thickness of not less than 20 μm,
the concentration of at least one element selected from Li, Na, K, F, Cl, Br, and I in the first region is $1\times10^{15}$ atoms/cm$^3$ or higher, and
the second region satisfies one or more conditions selected from the following (a) to (c):
(a) the Si concentration is $5\times10^{16}$ atoms/cm$^3$ or higher;
(b) the O concentration is $3\times10^{16}$ atoms/cm$^3$ or lower; and
(c) the H concentration is $1\times10^{17}$ atoms/cm$^3$ or lower.

2. The GaN substrate wafer according to claim 1, satisfying one condition selected from the following (1) to (3):
(1) having a diameter of 50 mm to 55 mm and a thickness of 250 μm to 450 μm;
(2) having a diameter of 100 mm to 105 mm and a thickness of 350 μm to 750 μm; and
(3) having a diameter of 150 mm to 155 mm and a thickness of 450 μm to 800 μm.

3. The GaN substrate wafer according to claim 1, wherein the minimum thickness of the second region is 300 μm or less.

4. The GaN substrate wafer according to claim 1, wherein a main surface of the Ga-polar side is a flat surface.

5. The GaN substrate wafer according to claim 4, wherein the regrowth interface is inclined with respect to the main surface of the Ga-polar side.

6. The GaN substrate wafer according to claim 5, wherein a difference in the thickness of the second region between one end and the other end in the inclination direction of the regrowth interface is not larger than 200 μm.

7. The GaN substrate wafer according to claim 1, wherein the first region has an H concentration of $1\times10^{17}$ atoms/cm$^3$ or higher.

8. The GaN substrate wafer according to claim 1, wherein the first region has an O concentration of $1\times10^{17}$ atoms/cm$^3$ or higher.

9. The GaN substrate wafer according to claim 1, wherein the first region has an F concentration of $1\times10^{15}$ atoms/cm$^3$ or higher.

10. The GaN substrate wafer according to claim 1, wherein at least a portion of the second region has a total compensating impurity concentration of $1\times10^{17}$ atoms/cm$^3$ or higher.

11. The GaN substrate wafer according to claim 10, wherein
the second region comprises a main doped region comprising at least the main surface of the Ga-polar side, and
the main doped region has a total compensating impurity concentration of $1\times10^{17}$ atoms/cm$^3$ or higher.

12. The GaN substrate wafer according to claim 11, wherein the total compensating impurity concentration in the main doped region is $1\times10^{18}$ atoms/cm$^3$ or higher.

13. The GaN substrate wafer according to claim 11, wherein, in the main doped region, the total compensating impurity concentration is twice or more of a total donor impurity concentration.

14. The GaN substrate wafer according to claim 11, wherein the main doped region comprises at least one element selected from carbon and transition metal elements.

15. The GaN substrate wafer according to claim 11, wherein an impurity contained in the main doped region at a highest concentration is Fe, Mn, or C.

16. The GaN substrate wafer according to claim 11, wherein
the main doped region is a region within a specific length from the main surface of a Ga-polar side, and
the specific length is not less than 20 μm.

17. The GaN substrate wafer according to claim 11, wherein, in the main doped region, a variation in the total compensating impurity concentration along a c-axis direction is in a range of ±25% from a median value.

18. The GaN substrate wafer according to claim 11, wherein
the main doped region is a region within a specific length from the main surface of the Ga-polar side, and
the specific length is 50% or more of the minimum thickness of the second region.

19. The GaN substrate wafer according to claim 10, wherein the second region has a total compensating impurity concentration of $5\times10^{19}$ atoms/cm$^3$ or lower.

20. The GaN substrate wafer according to claim 1, wherein at least a portion of the second region has a total donor impurity concentration of $1\times10^{18}$ atoms/cm$^3$ or higher.

21. The GaN substrate wafer according to claim 20, wherein
the second region comprises a main doped region comprising at least the main surface of the Ga-polar side, and
the main doped region has a total donor impurity concentration of $1\times10^{18}$ atoms/cm$^3$ or higher.

22. The GaN substrate wafer according to claim 21, wherein the total donor impurity concentration in the main doped region is $2\times10^{18}$ atoms/cm$^3$ or higher.

23. The GaN substrate wafer according to claim 21, wherein an impurity contained in the main doped region at a highest concentration is Si or Ge.

24. The GaN substrate wafer according to claim 21, wherein, in the main doped region, the total donor impurity concentration excluding Si is 10% or less of the Si concentration.

25. The GaN substrate wafer according to claim 24, wherein, in the main doped region, the concentrations of donor impurity elements excluding Si and O are independently lower than $1 \times 10^{15}$ atoms/cm$^3$.

26. The GaN substrate wafer according to claim 23, wherein, in the main doped region, the Ge concentration is $1 \times 10^{18}$ atoms/cm$^3$ or higher and the Si concentration is $4 \times 10^{17}$ atoms/cm$^3$ or higher.

27. The GaN substrate wafer according to claim 21, wherein
the main doped region is a region within a specific length from the main surface of the Ga-polar side, and
the specific length is not less than 20 μm.

28. The GaN substrate wafer according to claim 27, wherein, in the main doped region, a variation in the total donor impurity concentration along the c-axis direction is in a range of ±25% from a median value.

29. The GaN substrate wafer according to claim 21, wherein
the main doped region is a region within a specific length from the main surface of the Ga-polar side, and
the specific length is 50% or more of the minimum thickness of the second region.

30. The GaN substrate wafer according to claim 20, wherein the second region has a total donor impurity concentration of $5 \times 10^{19}$ atoms/cm$^3$ or lower.

31. An epitaxial wafer, comprising:
the GaN substrate wafer according to claim 1; and
a nitride semiconductor layer epitaxially grown on the main surface of the Ga-polar side of the GaN substrate wafer.

32. A method of producing an epitaxial wafer, the method comprising the steps of:
preparing the GaN substrate wafer according to claim 1; and
epitaxially growing a nitride semiconductor layer on the main surface of the Ga-polar side of the GaN substrate wafer.

33. A method of producing a nitride semiconductor device, the method comprising the steps of:
preparing the GaN substrate wafer according to claim 1;
growing a nitride semiconductor layer on the main surface of the Ga-polar side of the GaN substrate wafer to obtain an epitaxial wafer; and
removing at least a portion of the first region of the GaN substrate wafer.

* * * * *